United States Patent
Suzuki et al.

(10) Patent No.: US 8,203,157 B2
(45) Date of Patent: Jun. 19, 2012

(54) LIGHT EMITTING DEVICE HAVING HEAT GENERATING COLOR CONVERSION MEMBERS

(75) Inventors: Tomonori Suzuki, Osaka (JP);
Kenichiro Tanaka, Neyagawa (JP);
Youji Urano, Ikeda (JP)

(73) Assignee: Panasonic Corporation, Kadoma-shi (JP)

( * ) Notice: Subject to any disclaimer, the term of this patent is extended or adjusted under 35 U.S.C. 154(b) by 124 days.

(21) Appl. No.: 12/736,240

(22) PCT Filed: Mar. 26, 2009

(86) PCT No.: PCT/JP2009/056104
§ 371 (c)(1),
(2), (4) Date: Sep. 23, 2010

(87) PCT Pub. No.: WO2009/119733
PCT Pub. Date: Oct. 1, 2009

(65) Prior Publication Data
US 2011/0006323 A1 Jan. 13, 2011

(30) Foreign Application Priority Data

Mar. 26, 2008 (JP) ................................. 2008-082156

(51) Int. Cl.
*H01L 29/20* (2006.01)
*H01L 33/00* (2010.01)
*H01L 29/201* (2006.01)
*H01L 29/22* (2006.01)
*H01L 29/227* (2006.01)
*H01L 31/00* (2006.01)

(52) U.S. Cl. ................. 257/89; 257/90; 257/95; 257/98; 257/440; 257/E31.121; 257/E33.075

(58) Field of Classification Search .................... 257/89, 257/90, 95, 98, 440, E31.121, E33.075
See application file for complete search history.

(56) References Cited

U.S. PATENT DOCUMENTS 7,138,660 B2 * 11/2006 Ota et al. ........................ 257/79
(Continued)

FOREIGN PATENT DOCUMENTS

JP 2005-340472 A 12/2005
(Continued)

OTHER PUBLICATIONS

International Search Report dated Jun. 30, 2009, issued in PCT/JP2009/056104.
Korean Official Action dated Oct. 25, 2011.

*Primary Examiner* — Ida M Soward
(74) *Attorney, Agent, or Firm* — Edwards Wildman Palmer LLP

(57) ABSTRACT

A lighting device including an LED chip having a light emitting surface, and being configured to emit a light from the light emitting surface, a mounting substrate being configured to mount the LED chip, a first color conversion member including a first light transmissive material and a first phosphor, the first phosphor being excited by the light which is emitted from the LED chip, thereby giving off a first light having a wavelength which is longer than a wavelength of the light emitted from the LED chip, the first color conversion member being directly disposed on the light emitting surface of the LED chip, a second color conversion member including a second light transmissive material and a second phosphor, the second phosphor being excited by the light which is emitted from the LED chip, thereby giving off a second light having a wavelength which is longer than the wavelength of the light emitted from the LED chip, the second color conversion member being shaped to have a dome-shape, wherein the LED chip and the first color conversion member are disposed between the mounting substrate and the second color conversion member.

10 Claims, 9 Drawing Sheets

U.S. PATENT DOCUMENTS

| | | | |
|---|---|---|---|
| 7,446,343 B2 * | 11/2008 | Mueller et al. | 257/89 |
| 7,800,124 B2 * | 9/2010 | Urano et al. | 257/98 |
| 7,956,372 B2 * | 6/2011 | Kamada et al. | 257/98 |
| 8,070,316 B2 * | 12/2011 | Urano et al. | 362/249.02 |
| 2004/0135504 A1 * | 7/2004 | Tamaki et al. | 313/512 |
| 2006/0226758 A1 * | 10/2006 | Sofue et al. | 313/483 |
| 2007/0075306 A1 | 4/2007 | Hayashi et al. | |
| 2008/0048200 A1 * | 2/2008 | Mueller et al. | 257/98 |
| 2008/0258164 A1 * | 10/2008 | Masui et al. | 257/98 |
| 2009/0095967 A1 * | 4/2009 | Masui et al. | 257/98 |
| 2009/0128028 A1 * | 5/2009 | Hildenbrand et al. | 313/507 |
| 2009/0236621 A1 * | 9/2009 | Chakraborty | 257/95 |
| 2010/0207139 A1 * | 8/2010 | Winkler et al. | 257/98 |

FOREIGN PATENT DOCUMENTS

| | | |
|---|---|---|
| JP | 2007-035885 A | 2/2007 |
| JP | 2007-116138 A | 5/2007 |
| JP | 2007-243054 A | 9/2007 |
| JP | 2007-243055 A | 9/2007 |
| KR | 10-2007-0079956 | 8/2007 |

* cited by examiner

Fig. 2

| | (1) | (2) | (3) | (4) |
|---|---|---|---|---|
| cross sectional view | 10—[]—30 | 40 10<br>50 []—30 | 40 10—61<br>50 []—30 | 80 40 10—61 62<br>50 []—30 |
| light output (mW) | 446 | (580) | 280 | 209 |

Fig. 3

| | (1) | (2) | (3) | (4) |
|---|---|---|---|---|
| cross sectional view | 10 — 30 | 40 — 10, 50 — , — 30 | 40 — 10 — 61, 50 — , — 30 | 40 10 — 61, 50 — — 62, 80 — , — 30 |
| light output (mW) | 393 | (511) | 321 | 206 |

LIGHT EMITTING DEVICE HAVING HEAT GENERATING COLOR CONVERSION MEMBERS

TECHNICAL FIELD

This invention relates to a lighting device using an LED chip (light emitting diode chip).

BACKGROUND ART

Japanese patent application publication No. 2007-35885 discloses a prior lighting device. The prior lighting device comprises a combination of an LED chip and a phosphor, whereby the prior lighting device outputs light having a desired color. The desired color of light is, such as, a white light.

The prior lighting device comprises an LED chip, a mounting substrate, a light transmissive sealing member, a first color conversion member, and a second light conversion member. The mounting substrate is realized by a ceramic substrate. The mounting substrate is provided for mounting the LED chip. The light transmissive sealing member is made of a light transmissive sealing material such as silicone resin. The light transmissive sealing member is shaped to have a hemisphere shape, whereby the light transmissive sealing member is cooperative with a mounting surface of the mounting substrate to seal the LED chip. The first color conversion member comprises a first light transmissive member. The first light transmissive member is made of a first light transmissive material such as a silicone resin and a phosphor. The phosphor is configured to be excited by the light which is emitted from the LED chip, whereby the phosphor emits the light which has a wavelength which is longer than a wavelength of the light which is emitted from the LED chip. The first color conversion member is shaped to have a dome-shape. The first color conversion member is attached to the mounting substrate such that the first color conversion member is located at a side of the light output surface of the light transmissive sealing member. The second color conversion member comprises a second light transmissive member. The second light transmissive member is made of a second light transmissive material and a second phosphor. The second light transmissive material is such as a silicone resin. The second phosphor is configured to be excited by the light which is emitted from the LED chip, whereby the second phosphor emits the light which has a wavelength which is longer than the wavelength of the light which is emitted from the LED chip. The second color conversion member is shaped to have a dome-shape. The second color conversion member is disposed on the mounting substrate so that a light transmissive layer is interposed between the first color conversion member and the second color conversion member. The LED chip is realized by a blue light emitting diode chip (blue LED chip). The first phosphor has a first optical absorptance with respect to the light which is emitted from the LED chip. The second phosphor is realized by a phosphor which has a second optical absorptance with respect to the light which is emitted from the LED chip. The second optical absorptance is greater than the first optical absorptance.

In the above lighting device, both the first color conversion member and the second color conversion member are shaped to have the dome shapes. Therefore, this configuration makes possible to prevent a color unevenness of the light. In addition, the second phosphor has the second optical absorptance which is greater than the first optical absorptance of the first phosphor. Therefore, it is possible to improve quantum efficiency, whereby the efficiency of a light extraction to an outside of the lighting device is enhanced.

DISCLOSURE OF THE INVENTION

Problems to be Resolved by the Invention

By the way, in the prior lighting device, not only the LED chip but also the first phosphor of the first color conversion member and the second phosphor of the second color conversion member generate the heat when the lighting device is turned on. The heats are caused by an energy loss due to the stokes-shift. Both the first color conversion member and the second color conversion member attached to the mounting substrate via rims of the first color conversion member and the second color conversion member. Therefore, the heats of both the first color conversion member and the second color conversion member are not capable of being released effectively. A temperature difference in each the color conversion member causes a temperature quenching. Similarly, a temperature increase also causes the temperature quenching. Due to the temperature quenching, the quantum efficiency is lowered. That is, the prior lighting device has a problem of the chromaticity shift which is caused when the balance between the light emitted from the LED chip and the light which is given off from each the color conversion member is disrupted. In addition, the prior lighting device also has a problem of the reduction of the light output which is caused when the balance between the light emitted from the LED chip and the light which is given off from each the color conversion member is disrupted.

The invention is achieved to solve the above problem. An object is to prevent the color unevenness and to prevent the temperature quenching due to the temperature increase of the phosphor in the lighting device.

Means of Solving the Problems

In order to solve the above problem, a lighting device in this invention comprises an LED chip, a mounting substrate, a first color conversion member, and a second color conversion member. The LED chip has a light emitting surface. The LED chip is configured to emit a light from the light emitting surface. The mounting substrate is configured to mount the LED chip. The first color conversion member comprises a first light transmissive material and a first phosphor. The first phosphor is excited by the light which is emitted from the LED chip, thereby giving off a first light having a wavelength which is longer than a wavelength of the light which is emitted from the LED chip. The first color conversion member is directly disposed on the light emitting surface of the LED chip. The second color conversion member comprises a second light transmissive material and a second phosphor. The phosphor is excited by the light which is emitted from the LED chip, thereby giving off a second light having a wavelength which is longer than the wavelength of the light which is emitted from the LED chip. The second color conversion member is shaped to have a dome-shape. The LED chip and the first color conversion member are disposed between the mounting substrate and the second color conversion member.

In this case, the second color conversion member is disposed on the mounting substrate such that the second color conversion member covers the first color conversion member. Therefore, it is possible to prevent the color unevenness of the light which is emitted from the lighting device. In addition, the first color conversion member is directly disposed on the light emitting surface of the LED chip. Therefore, it is possible to transfer the heat of the first color conversion member to the mounting substrate through the LED chip. That is, it is possible to prevent the temperature quenching which is caused by the increase of the temperature of the first phosphor and the second phosphor.

It is preferred that the first color conversion member is configured to generate heat having a first amount of heat generation when the first color conversion member is excited by the light which is emitted from the light. The second color conversion member is configured to generate heat having a second amount of heat generation when the second color conversion member is excited by the light which is emitted from the LED chip. The first amount of the heat generation is greater than the second amount of the heat generation.

In this case, the first amount of the heat generation of the heat which is generated in the first color conversion member is greater than the second amount of the heat generation of the heat which is generated in the second color conversion member. Therefore, it is possible to prevent the temperature increase of the second phosphor of the second color conversion member. Furthermore, the heat which is generated in the first phosphor of the first color conversion member is transferred to the mounting substrate through the LED chip. Consequently, it is possible to prevent the temperature quenching which is caused by the temperature increase of the first phosphor and the second phosphor.

It is preferred that the lighting device comprises a sealing layer. The sealing layer comprises a cap and a light transmissive sealing member. The cap is cooperative with the mounting substrate to incorporate the LED chip and the first color conversion member therein. The light transmissive sealing member is disposed to fill a space between the cap and the mounting substrate. The second color conversion member has a rim. The second color conversion member is attached to the mounting substrate via the rim. Consequently, the second color conversion member surrounds the LED chip, the first color conversion member, and the sealing layer. The second color conversion member is attached to the mounting substrate so as to leave an air layer between the second color conversion member and the cap.

It is more preferred that the second color conversion member is attached to the mounting substrate so as to leave the air layer between the second color conversion member and an entire outside surface of the cap.

In this case, the air layer prevents the light which is given off by the second phosphor from traveling toward the cap. Therefore, it is possible to obtain the lighting device comprising the second color conversion member being configured to give off the light which is emitted to the outside of the second color conversion member. Furthermore, it is possible to increase options of the materials of the first phosphor and the second phosphor.

It is preferred that the first color conversion member has an emission surface for emitting the first light. The emission surface is located to be opposed to the second color conversion member. The emission surface is shaped to have an irregular structure with a concave-convex profile.

In this case, the light which is emitted from the LED chip and which is transmitted through the first color conversion member is emitted to the second color conversion member efficiently. Similarly, the light which is given off from the first phosphor is emitted to the second color conversion member through the emission surface effectively. Therefore, the light which is given off from and through the first color conversion member is effectively emitted to the second color conversion member. Furthermore, it is possible to prevent the temperature increase of the first color conversion member.

It is preferred that the lighting device comprises a light transmissive sealing member. The light transmissive sealing member is attached to the mounting substrate so as to seal the LED chip and the first color conversion member. The light transmissive sealing member comprises a resin which is exclusive of phosphor or a glass which is exclusive of phosphor. The second color conversion member has a rim. The second color conversion member is attached to the mounting substrate via the rim. Consequently, the second color conversion member surrounds the LED chip, the first color conversion member, and the light transmissive sealing member. The second color conversion member is attached to the mounting substrate so as to leave an air layer between the cap and the second color conversion member.

It is more preferred that the second color conversion member is attached to the mounting substrate so as to leave the air layer between the second color conversion member and an entire outside surface of the light transmissive sealing member.

In this case, the light transmissive sealing member generates no heat. Therefore, it is possible to transfer the heat which is generated in the first color conversion member to the mounting substrate through the LED chip.

It is preferred that the light emitting surface has a first dimension. The first color conversion member is shaped to have a sheet shape. The first color conversion member is disposed on the light emitting surface. The first color conversion member has a planar dimension which is equal to or smaller than the first dimension. The first color conversion member is disposed on the light emitting surface such that the first color conversion member is located within an outer circumference of the light emitting surface.

In this case, it is possible to transfer the heat which is generated in the first color conversion member through only the LED chip.

It is preferred that the lighting device comprises a light transmissive sealing member. The light transmissive sealing member is disposed on the mounting substrate so as to seal the LED chip and the first color conversion member. The light transmissive sealing member comprises a resin which is exclusive of phosphor or a glass which is exclusive of phosphor. The second color conversion member has a rim. The second color conversion member is attached to the mounting substrate via the rim. Consequently, the second color conversion member surrounds the LED chip, the first color conversion member, and the light transmissive sealing member. The second color conversion member is attached to the mounting substrate so as to leave an air layer between the second color conversion member and an entire outside surface of the light transmissive sealing member.

These and still other objects and advantages will become apparent from the following detail description referring to the attached drawings.

BRIEF EXPLANATION OF THE DRAWINGS

FIG. 2 shows an explanation illustration of the lighting device in the first embodiment.

FIG. 3 shows an explanation illustration of the lighting device in the second embodiment.

BEST MODE FOR CARRYING OUT THE INVENTION

First Embodiment

Figure 1:
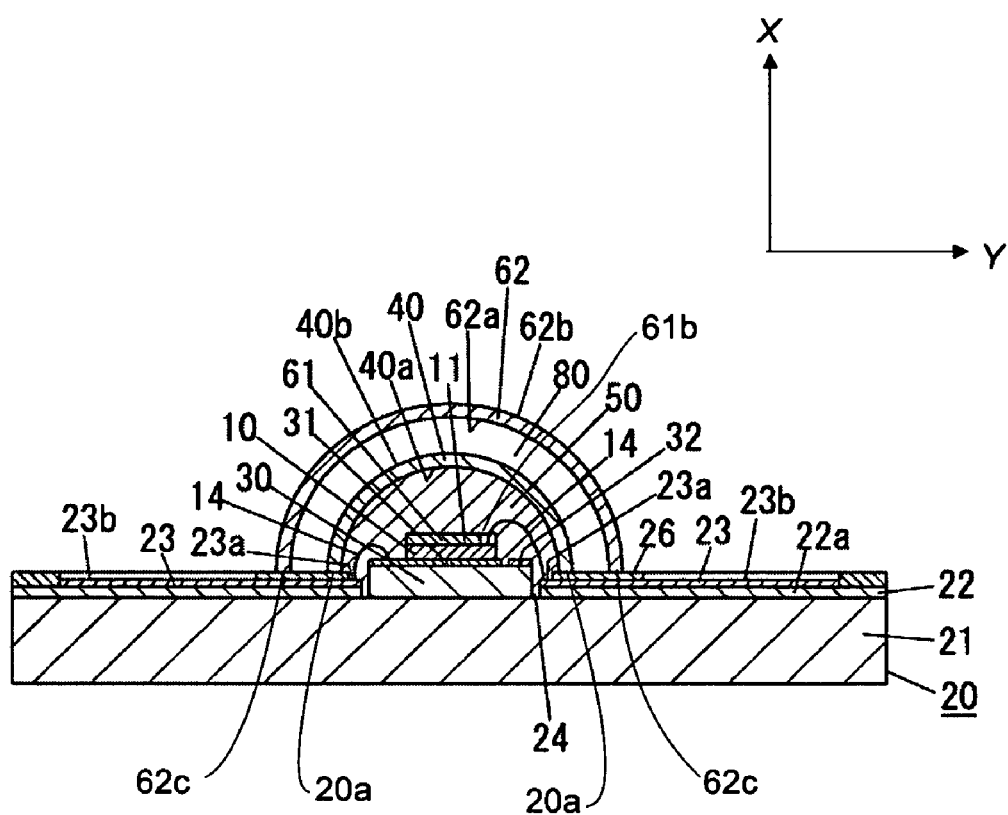
FIG. 1 shows a schematic side cross sectional view of the lighting device in the first embodiment.

The lighting device in the present embodiment is explained with attached drawings. It is noted that the X direction indicated by an arrow shows an upper direction of the lighting device. Y direction indicated by an arrow shows a left direction of the lighting device. FIG. 1 shows the lighting device in this embodiment. The lighting device comprises an LED chip 10, a mounting substrate 20, a first color conversion member 61, and a second color conversion member 62. The LED chip 10 has a light emitting surface 11. The mounting substrate 20 is shaped to have a mounting surface for mounting the LED chip 10. The first color conversion member 61 shaped to have a sheet shape. The first color conversion member 61 is directly disposed on the light emitting surface 11 of the LED chip 10. The first color conversion member 61 is made of a first light transmissive material with a first phosphor. The first phosphor is excited by the light which is emitted from the LED chip 10 so as to give off the light having a wavelength which is longer than a wavelength of the light which is emitted from the LED chip. The second color conversion member 62 is shaped to have a dome shape. The second color conversion member 62 is composed of a second light transmissive material with a second phosphor. The second phosphor is excited by the light which is emitted from the LED chip 10 so as to give off the light which has a wavelength which is longer than the wavelength of the light which is emitted from the LED chip 10. The second color conversion member 62 has a rim 62c. The second color conversion member 62 is attached to the mounting substrate 20 via the rim 62c such that the second color conversion member 62 covers the first color conversion member 61 and the LED chip. Consequently, the first color conversion member 61 and the LED chip 10 are located between the second color conversion member 61 and the mounting substrate 20. Therefore, the light which is emitted from the light emitting surface 11 of the LED chip 10 is emitted to an outside of the lighting device through the first color conversion member 61 and the second color conversion member 62.

In the lighting device of this embodiment, the second color conversion member 62 is disposed such that the second color conversion member is cooperative with the mounting surface of the mounting substrate 20 to surround the first color conversion member 61 and the LED chip 10. The second color conversion member 62 comprises a sealing layer which is located to fill the space between the second color conversion member 62 and the mounting substrate. The sealing layer is composed of a cap 40 and a light transmissive sealing member 50. The cap 40 is shaped to have a rim 20a. The cap 40 attached to the mounting substrate 20. Consequently, the cap 40 is cooperative with the mounting substrate to form a space for placing the first color conversion member 61 and the LED chip. The light transmissive sealing material 50 is disposed at a space between cap 40 and the mounting substrate 20 such that the light transmissive sealing material 50 fills the space which is surrounded by the cap 40 and the mounting substrate 20. An air gap 80 is formed between a light exit surface 40b of the cap 40 and a light entry surface 62a of the second color conversion member 62. The air gap 80 covers an entire outer surface of the second color conversion member 62. The air gap 80 is filled with a gas. That is, the second color conversion member 62 is attached to the mounting substrate 20 such that the second color conversion member 62 is cooperative with the outer surface of the cap 40 to form the air layer which covers the entire outer surface of the cap 40.

In the lighting device of this embodiment, the LED chip is realized by a blue LED chip which is configured to emit blue light. The first phosphor of the first color conversion member 61 is realized by a green phosphor. The green phosphor is configured to be excited by a light which is emitted from the LED chip so as to give off the green light. The second phosphor of the second color conversion member 62 is realized by a red phosphor. The red phosphor is configured to be excited by the light which is emitted from the LED chip 10 so as to give off the red light. Consequently, the lighting device in this embodiment is configured to produce white light from the mixture of the blue light, the green light, and the red light. The white light emitted from the lighting device has a high color rendering properties.

The LED chip 10 has a first surface in one end of a thickness direction, and a second surface in the other end of the thickness direction. The LED chip 10 is provided at its first surface (upper surface in FIG. 1) with an anode electrode which is not shown. The LED chip 10 is provided at its second surface (lower surface in FIG. 1) with a cathode electrode which is not shown. Therefore, the LED chip 10 has the first surface which acts as the light emitting surface 11. The light emitting surface 11 has a first dimension. The anode electrode and the cathode electrode are made from stacked films which comprise a bottom layer and a top layer. The bottom layer is made of Ni. The top layer is made of Au.

The mounting substrate 20 comprises a sub-mount substrate 30, a heat transfer plate 21, and a wiring substrate 22. The sub-mount substrate 30 is made of a first heat conductive material such as AlN. The sub-mount substrate 30 is shaped to have a rectangular shape, and has a first surface which mounts the LED chip 10. The heat transfer plate 21 is made of a second heat conductive material such as Cu and Al. The heat transfer plate 21 is attached to a center of the sub-mount substrate 30. The wiring substrate 22 is realized by a flexible print wiring substrate having a rectangular plate shape. The wiring substrate 22 is attached to the first surface of the heat transfer plate 21 by a bonding sheet such as polyolefin series (which is not shown). The wiring substrate 22 is shaped to at its center with a rectangular aperture 24 for exposing the sub-mount substrate 30. Therefore, the heat generated in the LED chip 10 is transferred to the sub mount substrate 30 and the heat transfer plate 21 without passing through the wiring substrate 22.

The wiring substrate 22 comprises an electrically insulation substrate 22a which is made of a polyimide film. The wiring substrate 22 is provided at its first surface with a pair of patterned wiring 23, 23 for supplying the electrical power to the LED chip 10. In addition, the wiring substrate 22 further comprises a resist film which has a white color and which covers the patterned wirings 23 and a portion other than the patterned wiring 23 of the electrically insulation substrate 22a. The cathode electrode of the LED chip 10 is electrically coupled to the first patterned wiring 23 via a bonding wire 14. The anode electrode of the LED chip 10 is electrically connected to the second patterned wiring 23 through the bonding wire 14. In addition, each the patterned wiring 23 has an outer circumferential shape which is smaller than half an outer circumferential shape of the electrically insulation substrate 22*a*. In addition, it is possible to employ the electrically insulation substrate 22*a* made of a FR4, a FR5, and a paper phenol resin.

Each the patterned wiring 23 has a first portion which is located adjacent to the aperture 24 of the wiring substrate 22. The resist film 26 is disposed so as to expose the first portion of each the patterned wiring 23. Each the patterned wiring 23 has a second portion which is located at a periphery of the wiring substrate 22. The resist film 26 is disposed so as to expose the second portion of each the patterned wiring 23. The first portion which is exposed and which is located adjacent to the aperture 24 of the wiring substrate 22 acts as terminal ends 23*a* which is connected to the bonding wire 14. The second portion of the patterned wirings 23 is shaped to have a circular shape. The second portion acts as electrodes 23*b*. The electrodes 23*b* are used for connection to the outside. It should be noted that patterned wirings 23 are made of a stacked film. The stacked film comprises a Cu film, a Ni film, and an Au film. A topmost film of the stacked film is realized by the Au film.

In addition, the sub mount substrate 30 is made of AlN as the first heat conductive material. The AlN has a high heat conductivity, and also has an electrical insulation property. The sub mount substrate 30 has a planar size which is larger than a side of the LED chip 10. The sub mount substrate 30 fulfills a stress relaxation function of relaxing the stress applied to the LED chip 10 due to the difference of the coefficient of linear expansion between the LED chip and the heat transfer plate 21. Furthermore, the sub mount substrate 30 fulfills a heat transfer function of transferring the heat generated in the LED chip 10 to the area larger than the size of the LED chip 10. Therefore, the lighting device in this embodiment achieves the relaxation of the stress applied to the LED chip 10 due to the coefficient of the linear expansion between the LED chip 10 and the heat transfer plate 21. In addition, the lighting device in this embodiment also achieves the efficient heat release of the heat generated in the LED chip 10 to the sub mount substrate 30 and also to the heat transfer plate.

In this embodiment, the sub mount substrate 30 is made of the first heat conductive material such as AlN. However, the first heat conductive material is not limited to AlN. It is possible to employ a composite SiC and Si as the first heat conductive material, for example. In addition, the sub mount substrate 30 is provided at its first surface with the patterned electrode 31 which is electrically coupled to the anode electrode of the LED chip (located in a side of sub mount substrate 30). Furthermore, the sub mount substrate 30 is provided at its first surface with a reflective film 32 which surrounds the patterned electrode 31. The reflective film 32 is configured to reflect the visible light. The reflective film 32 prevents the sub mount substrate from absorbing the visible light which is emitted from the LED chip 10, whereby this configuration makes it possible to give off the light to the outside of the lighting device, effectively. The patterned electrode 31 is made of alloy including Au and Sn. (The ratio of Au to Sn is, for example, 80 to 20 and 70 to 30.) In addition, the reflective film 32 is made of Al. However, the material of the reflective film 32 is not limited to Al. That is, it is possible to employ the reflective film 32 made of Ag, Ni, and Au.

In addition, the sub mount substrate 30 of the lighting device has a thickness which is greater than a thickness of the resist film 26. Consequently, the upper surface of the sub mount substrate 30 is located at a level higher than a level of the top surface of the resist film 26. This configuration makes it possible to prevent the light emitted from the LED chip 10 from being absorbed by the wiring substrate exposed at an inner circumferential surface of the aperture 24. Similarly, this configuration also makes it possible to prevent the light given off from the red phosphor and the green phosphor from being absorbed by the wiring substrate 22 exposed at the inner circumferential surface of the aperture 24.

The light transmissive sealing material 50 is shaped to have a hemispherical shape. However, it is also possible to employ a light transmissive sealing material 50 being shaped to have a semielliptical shape. In addition, the light transmissive sealing material 50 is made of a silicone resin. However, it is possible to use an epoxy resin, an acrylic resin, a polycarbonate resin, and a glass as a material of the light transmissive sealing material 50.

The cap 40 is realized by a molded piece made of a third light transmissive material such as a silicone resin. The cap 40 is shaped to have a dome shape. The cap 40 is attached to the mounting substrate 20 such that the rim 20*a* of the cap 40 at a side of the mounting substrate 20 is attached to the mounting substrate 20 by an adhesive agent. The adhesive agent is exemplified by a silicone resin and an epoxy resin, and so on. In addition, the cap 40 has the light entry surface 40*a* which is located in a close contact with a light exit surface of the light transmissive sealing material 50. The cap 40 is cooperative with the light transmissive sealing material 50 to form the lens which is shaped to have a hemispherical shape. The cap 40 is made of a silicone resin. Therefore, the difference of the refractive indexes between the cap 40 and the light transmissive sealing material 50 is reduced. Similarly, the difference of the linear coefficient of expansions between the cap 40 and the light transmissive sealing material 50 is reduced. It is noted that the third light transmissive material of the cap 40 is not limited to the silicone resin. That is, for example, it is possible to use an epoxy resin, an acrylic resin, a polycarbonate resin, and a glass as the material of the third light transmissive material.

In addition, the sealing layer in this embodiment comprises a light transmissive sealing material 50 and a cap 40. However, it is possible to employ the sealing layer comprising a light transmissive sealing material 50 without the cap 40 may be used as the sealing layer.

The first color conversion member 61 comprises a first light transmissive material and the green phosphor as mentioned above. The first light transmissive material is the silicone resin. The green phosphor is used as the first phosphor. The first color conversion member 61 is shaped to have a sheet shape to have a uniform thickness. The first color conversion member 61 is disposed on the light emitting surface 11 of the LED chip 10 by the adhesive agent. The adhesive agent is, for example, the silicone resin and the epoxy resin. However, there is no need to use the adhesive agent when the first color conversion member 61 is disposed on the light emitting surface of the LED chip. It is possible to form the first color conversion member 61 on the light emitting surface 11 of the LED chip by means of a screen printing, an ink-jet technology, and so on. Furthermore, the shape of the first color conversion member 61 is not limited to the sheet shape. It is possible to form the first color conversion member 61 including the first phosphor by applying the first light transmissive material to the LED chip. Similarly, it is also possible to form the first color conversion member 61 including the first phosphor by dipping the LED chip into the first light transmissive material. In addition, it is possible for the first light transmissive material to have a light exiting surface with one or more convex curve. The first color conversion member 61 is shaped to have its periphery with a cutout for exposing a connection portion of the cathode electrode of the LED chip 10 and the bonding wire 14.

In addition, according to the above means of forming the first color conversion member 61, the first color conversion member 61 has a planar surface 61b which is perpendicular to an axis which is particular to the light emitting surface. In other words, the first color conversion member 61 is provided with a planar surface 61b which is parallel to the light emitting surface. In other words, the first color conversion member 61 has a dimension which is parallel to the planar surface 61b perpendicular to the axis perpendicular to the first color conversion member 61. The planar surface 61b of the first color conversion member 61 has a second dimension. The second dimension is smaller than a dimension of the light emitting surface. However the second dimension may be equal to the dimension of the light emitting surface. In addition, the first color conversion member 61 is disposed within an outer circumference of the light emitting surface.

In addition, the second color conversion member 62 comprises a second light transmissive material and the second phosphor. The second light transmissive material is made of a silicone resin. The second phosphor is made of a red phosphor as mentioned above. The second color conversion member 62 is shaped to have a dome shape. The second color conversion member 62 is attached to the mounting substrate 20 such that the rim 62c of the second color conversion member 62 is attached to the mounting substrate 20 by an adhesive agent. The adhesive agent is such as a silicone resin and an epoxy resin. The second color conversion member 62 is formed to have a light entry surface 62a which extends along the light exit surface 40b of the cap 40. Therefore, the light entry surface 62a of the second color conversion member 62 is spaced from the light exit surface 40b by an approximately constant distance in a normal direction. It should be noted that the second color conversion member 62 has a uniform thickness in the normal direction.

The first light transmissive material of the first color conversion member 61 and the second light transmissive material of the second color conversion member 62 are not limited to the silicone resin. It is possible to use the epoxy resin, the acrylic resin, the polycarbonate resin, the glass, an organic-inorganic hybrid material including an organic component mixed and combined with an inorganic component in a nanometer level or molecule level as the material of the first light transmissive material and the second light transmissive material.

The first color conversion member 61 in this embodiment is configured to generate heat having a first amount of heat generation when the first color conversion member 61 gives off the light. In addition, the second color conversion member 62 of this embodiment is configured to generate heat having a second amount of heat generation when the second color conversion member 62 gives off the light. An amount of the first phosphor of the first color conversion member 61 and an amount of the second phosphor of the second color conversion member 62 is arbitrarily determined such that the first amount of the heat generation is greater than the second amount of the heat generation. FIG. 2 shows a measurement result of a light output of the lighting device when the light output is measured in the manufacturing process of the lighting device. In this measurement, the LED chip which having a property of that "a temperature of the LED chip 10 becomes 80 degree C. and a color temperature becomes 5000K" when the LED chip 10 receives an operation electrical current of 500 mA is used. In addition, the measurement is performed under the condition where an operation electrical current of the 500 mA is applied to the LED chip 10. That is, (1) of FIG. 2 shows a condition where the LED chip 10 is not sealed. (2) of FIG. 2 shows a condition where the LED chip 10 is covered by the light transmissive sealing material 50 and the cap 40 while the first color conversion member 61 is not disposed on the LED chip 10. (3) of FIG. 2 shows a condition where first color conversion member 61 is disposed on the light emitting surface 11 of the LED chip 10, and the LED chip 10 is covered by the light transmissive sealing material 50 and the cap 40. (4) of FIG. 2 shows a condition where the air gap is provided between the second color conversion member 62 and the cap 40. In the condition of (2), a multiplication factor of the light extraction efficiency increased by the light transmissive sealing material 50 and the cap 40 is assumed as 580 mW, compared with the condition of (1). Consequently, the light output of the condition in (2) is assumed as 580 mW which is calculated by the product of 466 and 1.3. In addition, under the assumption of that the amount of the heat generation P1 of the first color conversion member 61 is calculated by the formula of "P1=[the amount of the light output in (2)]−[the amount of the light output in (3)]", the amount of the heat generation P1 of the first color conversion member 61 is equal to 300 mW. Similarly, under the assumption of that the amount of the heat generation P2 of the second color conversion member 62 is calculated by the formula of "P1=[the amount of the light output in (3)]−[the amount of the light output in (4)], the amount of the heat generation P2 of the second color conversion member 62 is equal to 71 mW. Therefore, P1 is greater than P2.

In addition, when the lighting device of the this embodiment is manufactured, it is preferred to prepare a plurality of the second color conversion members 62 which are different from each other in the concentration of the second phosphor. Consequently, prior to arrangement o the second color conversion member 62 to the mounting substrate 20, it is possible to dispose the second color conversion member 62 having an arbitrarily concentration of the second phosphor according to the detection result of the mixed color which is output from the cap 40. Consequently, the variability of the colors of the lights which are output from lighting device may be reduced.

As explained above, the lighting device in this embodiment comprises the dome shaped second color conversion member 62 which is attached to the mounting substrate by the rim 62c such that the dope shaped second color conversion member 62 covers the LED chip 10 and the first color conversion member 61. Therefore, it is possible to prevent the color unevenness of the light emitted from the lighting device. In addition, it is possible to obtain the lighting device being configured to easily regulate the color of the light to a desired color. Furthermore, the first color conversion member 61 is disposed on the light emitting surface 11 of the LED chip 10. The first color conversion member 61 comprises the first light transmissive material with the first phosphor. The first phosphor is configured to be excited by the light emitted from the LED chip 10 so as to give off the visible light which has the wavelength which is longer than the wavelength of the light which is emitted from the LED chip 10. The amount of the heat generation of the first color conversion member 61 is greater than the amount of the heat generation of the second color conversion member 62. Therefore, it is possible to prevent the temperature increase of the second phosphor of the second color conversion member 62. In addition, the heat generated in the first phosphor of the first color conversion member 61 is efficiently released to the mounting substrate 20 through the LED chip 10. Therefore, it is possible to prevent the temperature quenching due to the temperature increases of the first phosphor and also the second phosphor.

In addition, the light emitting surface 11 has a first dimension. The first color conversion member 61 has a second dimension. The second dimension is equal to or less than the first dimension. In addition, the first color conversion member is disposed on the light emitting surface 11 such that the first color conversion member 61 is located within the outer circumference of the light emitting surface 11. Therefore, the heat generated in the first color conversion member 61 is released to the mounting substrate 20 through the LED chip 11. Consequently, this configuration makes it possible to prevent the temperature quenching of the first phosphor and the second phosphor.

In addition, the cap 40 and the light transmissive sealing material 50 are made of a resin which is exclusive of the phosphor or a glass which is exclusive of the phosphor. Therefore, the cap 40 and the light transmissive sealing material 50 is not excited by the light emitted from the LED chip 10, whereby the cap 40 and the light transmissive sealing material 50 generates no heat. Therefore, the second color conversion member 62 is free from the heat influence from the light transmissive sealing material 50.

In addition, the lighting device in this embodiment has the space 80 between the light entry surface 62a of the second color conversion member 62 and the light exit surface 40b of the cap 40. The space 80 is filled with the medium realized by the gas such as air and inactive gas. Therefore, this configuration makes it possible to prevent the light of the second phosphor from returning toward the cap 40. Consequently, it is possible to enhance the light extraction efficiency to the outside. In addition, it is possible to broaden the choices of the materials of the first phosphor and the second phosphor.

In addition, the first color conversion member 61 is covered by the light transmissive sealing material 50 and the cap 40. The second color conversion member 62 is disposed so as to leave the air layer between the cap 40 and the second color conversion member 62. Therefore, when the heat generated in the first color conversion member is transferred to the light transmissive sealing material 50 and the cap 40, the heat in the light transmissive sealing material 50 and the cap 40 is released to the mounting substrate. That is, the air layer prevents the heat transfer of the heat to the second color conversion member from the light transmissive sealing material 50 and the cap 40.

In addition, in the lighting device of this embodiment, in a case where the desired color of the mixture light is white, the second phosphor is not limited to the red phosphor. It is possible to use many kinds of the phosphors from the blue to the red. That is, it is possible to employ two kinds of the phosphors such as red phosphor and the green phosphor. Furthermore, it is also possible to employ three kinds of the phosphors such as a yellow-green phosphor, a yellow phosphor, and an orange phosphor. This configuration makes it possible to easily match the color of the light. In addition, it is preferred to arbitrarily determine the colors of the lights which are given off from the first phosphor and the second phosphor. Consequently, it is possible to obtain the lighting device being configured to emit the light having the white color even if the LED chip 10 is realized by a violet LED chip or an UV LED chip.

Second Embodiment

The lighting device in this embodiment has basic components which are in common with the basic components of the lighting device in the first embodiment. In this embodiment, the lighting device in this embodiment is different from the lighting device in the first embodiment in the first phosphor and the second phosphor. That is, in this embodiment, the first phosphor of the first color conversion member 61 in FIG. 1 is realized by a red phosphor. The second phosphor of the second color conversion member 62 is realized by a green phosphor. In contrast, similar to the first embodiment, the amount of the first phosphor and the amount of the second phosphor are determined such that the amount of the heat generation of the first color conversion member 61 is greater than the amount of the heat generation of the second color conversion member 62. In the lighting device of this embodiment, FIG. 3 shows a measurement result of the light output in the manufacture process of the lighting device. In this measurement, the LED chip which has a property of that "a temperature of the LED chip 10 becomes 80 degree C. and a color temperature becomes 3800K" when the LED chip 10 receives an operation electrical current of 500 mA is used. In addition, the measurement is performed under the condition where an operation electrical current of the 500 mA is applied to the LED chip 10. (1) to (4) of FIG. 3 shows the conditions same as the conditions of (1) to (4) of FIG. 2. The amount of the heat generation P1 of the first color conversion member 61 is equal to 190 mW. The amount of the heat generation P2 of the second color conversion member 62 is equal to 115 mW. Therefore, P1 is greater than P2.

The lighting device in this embodiment comprises the second color conversion member 62. The second color conversion member 62 is shaped to have a dome shape. The second color conversion member 62 is attached to the mounting substrate 20 by the rim such that the second color conversion member 62 covers the first color conversion member 61 and the LED chip 10. The light emitted from the LED chip 10 is sent to the outside of the lighting device through the first color conversion member 61 and the second color conversion member 62. Therefore, it is possible to prevent the generation of the color unevenness to the surface where the light emitted from the lighting device is irradiated. In addition, it is possible to arbitrarily determine the second color conversion member 62. Consequently, it is possible to obtain the lighting device being configured to emit the light having a desired color easily. In addition, the first color conversion member 61 is disposed on the light emitting surface 11 of the LED chip 10. The first color conversion member 61 comprises a first light transmissive material with the first phosphor. The first phosphor is configured to be excited by the light emitted from the LED chip 10 so as to give off the visible light having a wavelength which is longer than the wavelength of the light of the LED chip 10. The amount of the heat generation of the first color conversion member 61 is greater than the amount of the heat generation of the second color conversion member 62. Therefore, it is possible to prevent the temperature increase of the second phosphor of the second color conversion member 62. In addition, the heat generated in the first phosphor of the first color conversion member 61 is released to the mounting substrate 20 through the LED chip 10. Consequently, it is possible to prevent the temperature quenching due to the temperature increases of the first phosphor and the second phosphor. It should be noted that the second phosphor is not limited to the green phosphor when the light having the white color is the desired mixed color. That is, it is possible to employ a plurality of phosphors such as the blue phosphor to the red phosphor. For example, it is possible to employ the two kinds of the phosphors such as the red phosphor and the green phosphor. It is also possible to employ the three kinds of the phosphors such as the yellow-green phosphor, the yellow phosphor, and the orange phosphor. Consequently, it is possible to easily match the color. In addition, it is preferred to arbitrarily determine the colors of the lights of the first phosphor and the second phosphor. Consequently, it is possible to produce the white light even if the violet LED chip and the UV LED chip is used as the LED chip 10.

In the lighting device of the first embodiment, the first phosphor of the first color conversion member 61 is the green phosphor. The second phosphor of the second color conversion member 62 is the red phosphor. In two kinds of the phosphors of the red phosphor and the green phosphor, "the green light which is given off from the green phosphor and which has an emission peak wavelength which is located at a lower side" is secondarily absorbed by "the red phosphor which is configured to give off the light having an emission peak wavelength which is located at a higher side".

In order to solve this problem, the lighting device in this embodiment comprises a first color conversion member 61 which has a red phosphor as the first phosphor, and a second color conversion member 62 which has a green phosphor as the second phosphor. Therefore, it is possible to prevent the light which is given off from the green phosphor and which has the emission peak wavelength being located at a lower side from being secondarily absorbed by the red phosphor being configured to give off the light which has the emission peak wavelength being located at a higher side.

Third Embodiment

A lighting device in this embodiment has basic components which are in common with the basic components of the lighting device in the first embodiment. The lighting device of this embodiment is different from the lighting device of the first embodiment in the first phosphor and the second phosphor. That is, the first phosphor of the first color conversion member 61 is the red phosphor in addition to the green phosphor. The second phosphor of the second color conversion member 62 is also the red phosphor in addition to the green phosphor.

That is, in the lighting device of this embodiment, the second color conversion member 62 is used as a color matching layer for matching the color of the light. Therefore, it is possible to decrease the amount of the heat generation in the second color conversion member 62, compared with the amount of the heat generation in the first color conversion member 61. This results in a prevention of the temperature increase of the second phosphor of the second color conversion member 62.

Fourth Embodiment

Figure 4:
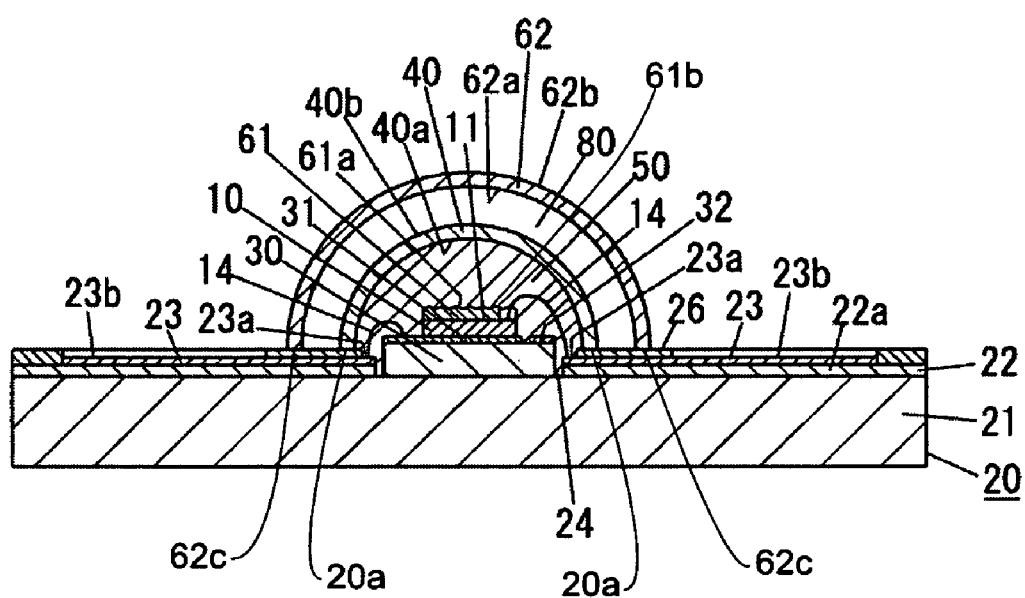
FIG. 4 shows a schematic side cross sectional view of the lighting device in the fourth embodiment.

FIG. 4 shows a lighting device in this embodiment. The lighting device in this embodiment has basic components which are in common with the components of the lighting device in the first embodiment. As shown in FIG. 4, the first color conversion member 61 has an emission surface 61*b*. The phosphor of the first color conversion member 61 is excited by the light which is emitted from the LED chip 10 so as to give off the light. The first color conversion member 61 is configured to give off the light which is emitted from the LED chip and also which is given off from the phosphor from the emission surface 61*b*. The emission surface 61*b* is unevenness (irregular surface). The unevenness emission surface 61*b* prevents "the light which is emitted from the LED chip 10" from being totally reflected by the emission surface 61*b*. The unevenness emission surface 61*b* also prevents "the light which is given off from the phosphor which is excited by the light emitted from the LED chip 10" from being totally reflected by the emission surface 61*b*. It is noted that the components in common with that of the first embodiment is designated by same reference numerals, whereby the explanations are omitted.

With this configuration, the light which is emitted from the LED chip 10 and which passes through the first color conversion member 61 is effectively emitted from the first color conversion member 61. In addition, the light which is given off from the first phosphor is effectively emitted from the first color conversion member 61. In addition, this configuration also makes it possible to prevent the temperature increase of the first color conversion member 61. It goes without saying that it is possible to apply the unevenness emission surface for prevention of the total reflection to the first color conversion member of the other embodiments.

Fifth Embodiment

Figure 5:
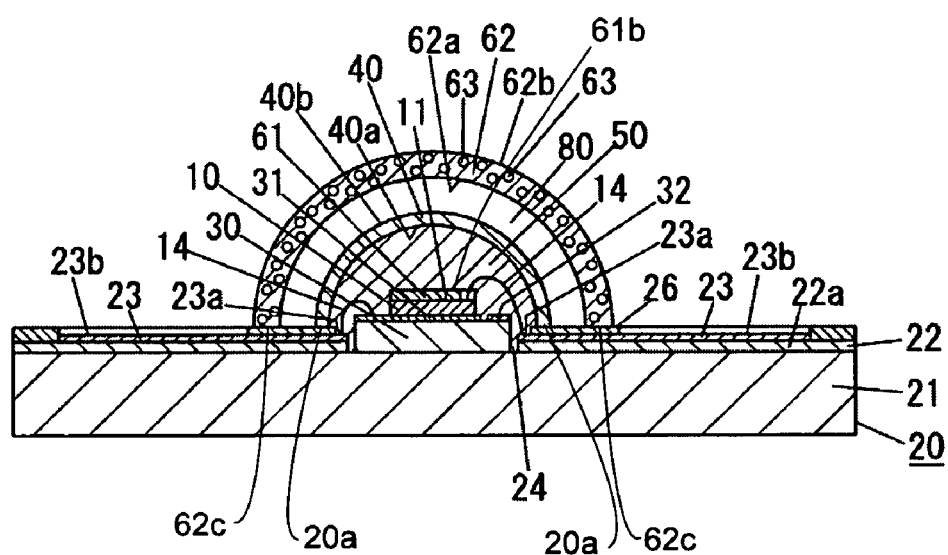
FIG. 5 shows a schematic side cross sectional view of the lighting device in the fifth embodiment.

A lighting device in this embodiment has components which are in common with the basic components of the first embodiment. As shown in FIG. 5, the lighting device of this embodiment is different from the lighting device of the first embodiment in the following feature. That is, the second color conversion member 62 comprises the second light transmissive material and light diffusion members 63. The light diffusion members 63 have refractive indexes which are different from a refractive index of the second light transmissive material. The light diffusion members 63 are shaped to have a spherical shape. The light diffusion members 63 are dispersed into the light transmissive material. In this embodiment, the components in common with that of the first embodiment are designated by the same reference numerals, whereby the explanations are omitted.

It is possible to employ the light diffusion member 63 which is made of transparent inorganic material such as $SiO_2$ (glass), $TiO_2$, and $Al_2O_3$. It is also possible to employ the light diffusion member 63 which is made of organic material which has a refractive index which is different from the refractive index of the second light transmissive material. The organic material is exemplified by a silicone resin and so on. In this case, it is preferred to employ the light diffusion member 73 having a high refractive index because it is possible to increase the diffusion effect as the refractive index of the light diffusion member 73 is increased.

The second light transmissive material which acts as a base material of the second color conversion member 62 is not limited to the silicone resin. It is possible to use the glass instead of the silicone resin. In this case, it is possible to increase the temperature of the second color conversion member 62, compared with the case where the organic material such as silicone resin is used as the base material. In addition, it is possible to employ the high-melting point glass as the second color conversion member 62, and to employ the low-melting point glass as the light diffusion member 63.

In addition, the shape of the light diffusion member 63 is not limited to the spherical shape. A glass fiber, a mesh-like glass, and nanosized metal particles may use as the light diffusion members 63. In a case where the glass fiber is employed as the light diffusion member 63, the heat generated in the second phosphor of the second color conversion member is effectively released, compared with the case where the light diffusion member 63 is shaped to have a spherical glass. Therefore, this configuration makes it possible to prevent the partial heat generation in the second color conversion member 62. In contrast, in a case where the nanosized metal particles (such as nanosized particles of noble metals such as gold and silver) are used as the light diffusion member 63, the light diffusion member 63 receives the light which is emitted from the LED chip 10. When the light diffusion member 63 receives the light which is emitted from the LED chip 10, the surface plasmon polariton is excited at the surface of the light diffusion member 63. This results in the enhancement of the light which is emitted from the LED chip 10, whereby it is possible to enhance the light extract efficiency of extracting the light to the outside.

As explained above, the lighting device in this embodiment comprises the second color conversion member 62 which has the light diffusion member 63 which is diffused into the second color conversion member 62. Therefore, it is possible to prevent the color unevenness of the light which is irradiated to a surface from the lighting device. In addition, it is possible to enhance a heat radiation performance of the first color conversion member 61 and the second color conversion member 62. In addition, it is possible to diffuse the light diffusion member 63 to the second color conversion member 62 of the other embodiments.

Sixth Embodiment

Figure 6:
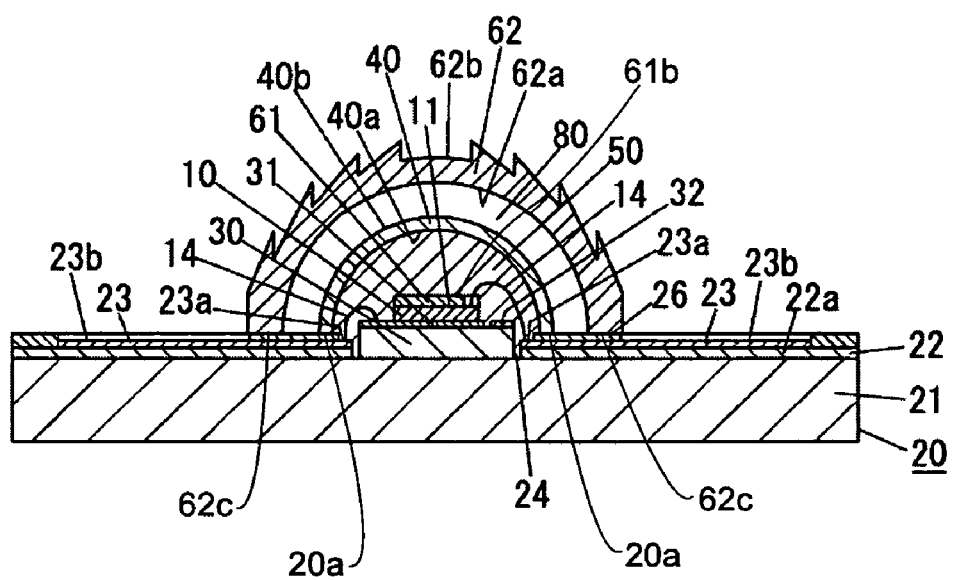
FIG. 6 shows a schematic side cross sectional view of the lighting device in the sixth embodiment.
Figure 7:
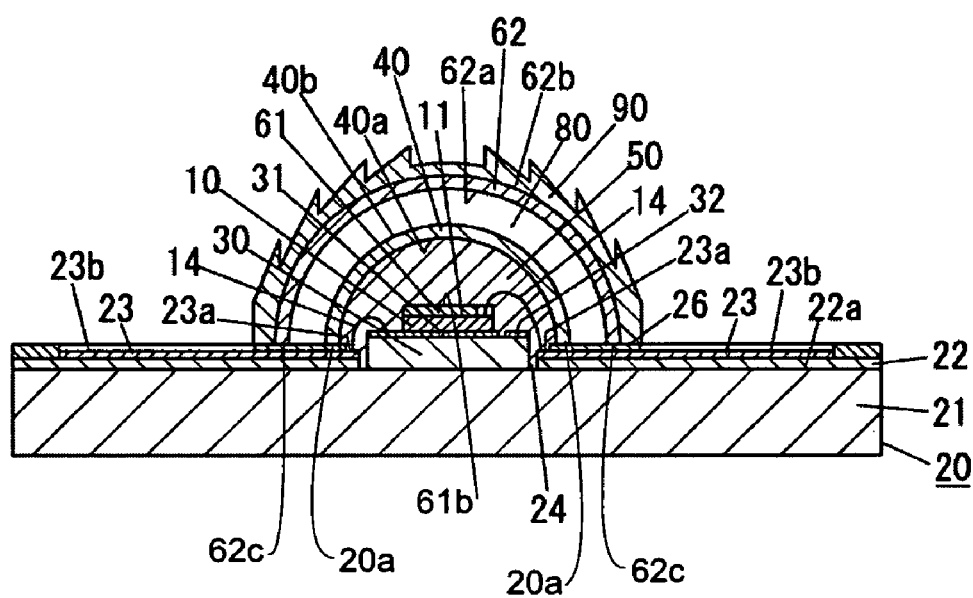
FIG. 7 shows a schematic side cross sectional view of the lighting device in the seventh embodiment.

A lighting device in this embodiment comprises basic components which are in common with the basic components of the first embodiment. As shown in FIG. 6, the second color conversion member 62 is shaped to act as the Fresnel lens, whereby the second color conversion member 62 has a light exit surface 62b which is unevenness (which has an irregularity surface). Therefore, the thickness of the second color conversion member 62 is varied according to the portion of the second color conversion member 62. Consequently, the second color conversion member 62 distributes the light which is emitted from the LED chip 10 and which is transmitted through the first color conversion member. Similarly, the second color conversion member 62 distributes the light which is given off from the first phosphor. In this embodiment, the components in common with the components of the first embodiment are designated by the same reference numerals, whereby the explanations are omitted.

With this configuration, in this embodiment, the light which is emitted from the LED chip 10 and which is passed through the first color conversion member 61 is distributed by the second color conversion member 62. In addition, the light which is given off from the first phosphor of the first color conversion member 61 is also distributed by the second color conversion member 62. Needless to say, it is possible to apply the shape of the second color conversion member 62 in this embodiment to the second color conversion member 62 of the lighting device other than this embodiment.

Seventh Embodiment

A lighting device in this embodiment has basic components which are in common with the basic components in the first embodiment. The lighting device of this embodiment is different from the lighting device of the first embodiment in the following feature. The different feature is that the lighting device further comprises the Fresnel lens 90. The Fresnel lens 90 is shaped to have a dome shape. The Fresnel lens 90 is disposed on the light exit surface 62b of the second color conversion member 62. In this embodiment, the components in common with the components of the first embodiment are designated by the same reference numerals, whereby the explanation is omitted.

With this configuration, in the lighting device of this embodiment, the light which is emitted from the LED chip 10 and which is transmitted through the first color conversion member 61 is distributed by the Fresnel lens 90. Similarly, the light which is given off from the first phosphor of the first color conversion member 61 is also distributed by the Fresnel lens 90. It is noted that the Fresnel lens 90 may be applied to the second color conversion member 62 in the first to fifth embodiment.

Eighth Embodiment

Figure 8:
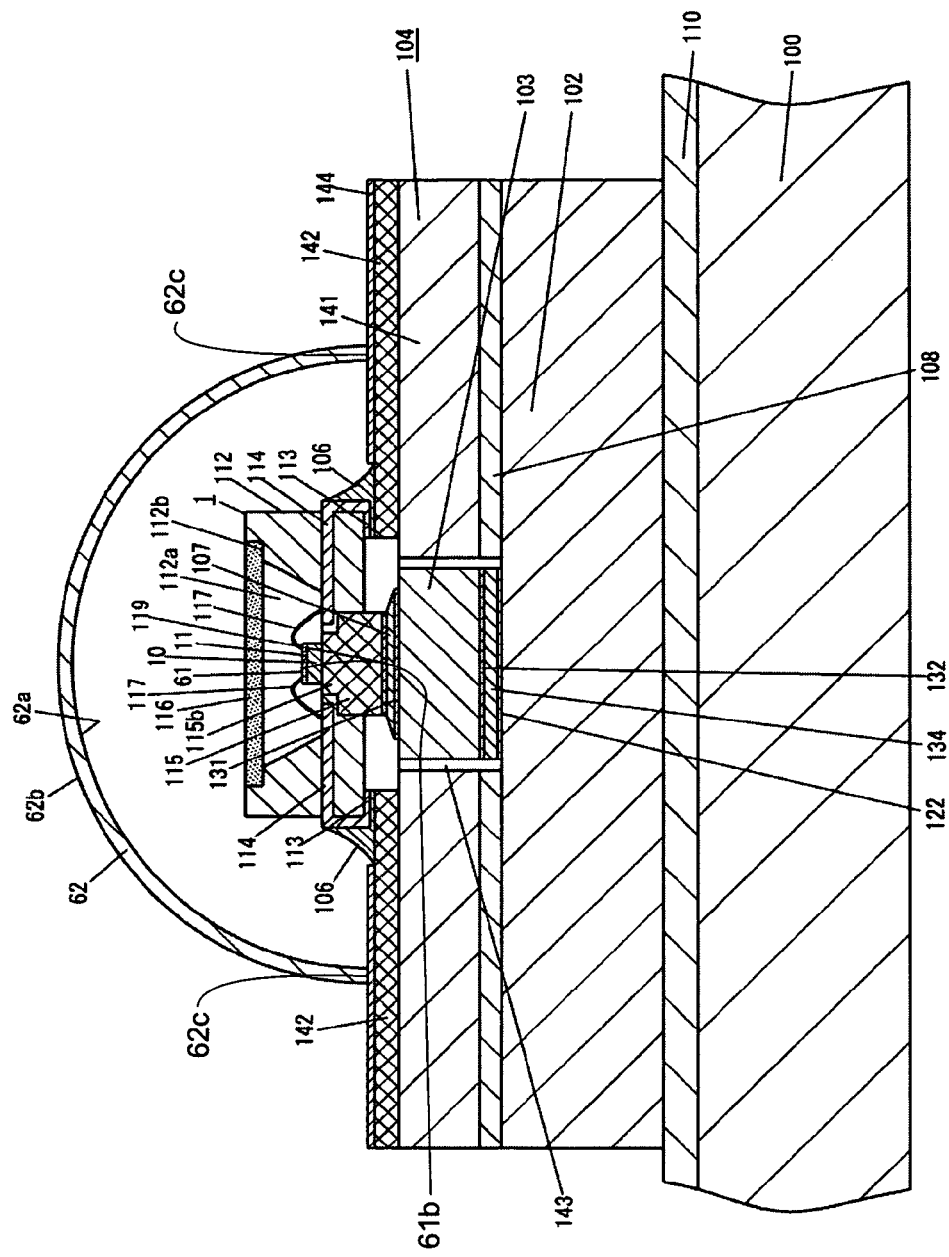
FIG. 8 shows a schematic side cross sectional view of the lighting device in the eighth embodiment.

A lighting device in this embodiment, shown in FIG. 8, comprises a heat transfer plate 102, a sub mount substrate 103, a wiring substrate 104, and an LED 1. The heat transfer plate 102 is made of a first heat conductive material such as Cu. The sub mount substrate 103 is mounted on the first surface of the heat transfer plate 102. The sub mount substrate 103 is made of the second heat conductive material such as AlN. The wiring substrate 104 comprises an electrical insulation substrate 141 and patterned wirings 142. The patterned wirings 142 are formed on the first surface of the electrical insulation substrate 141. The electrical insulation substrate 142 is formed with an aperture 143. The aperture 143 is penetrated through the electrical insulation substrate 142 along the thickness direction of the electrical insulation substrate 142. The aperture 143 is provided for disposing the sub mount substrate 103 within the aperture 143 such that entire circumference surface of the sub mount substrate 103 is spaced from the siring substrate 104. The LED 1 is an LED of surface mount type. In the LED 1, the package 112 incorporates the LED chip 10. The package 112 is provided with electrodes 113 for establishing the electrical connection to the outside. The electrodes 113 are connected to the patterned wirings 142 which are formed on the first surface of the wiring substrate 104. The electrodes 113 are electrically coupled to the patterned wiring via a first junction material such as solder. The rear surface of the package 112 is attached to the heat conductive member 115 for radiating the heat. The heat conductive member 115 is thermally coupled to the sub mount substrate 103 through the second junction member 107 which is made of a second junction material such as a solder. In addition, the lighting device further comprises a stress relaxation member 108. The stress relaxation member 108 is interposed between the heat transfer plate 102 and the wiring substrate 104 to couple the heat transfer plate 102 and the wiring substrate 104. The stress relaxation member 108 is configured to relax the stress applied to the junction members 106, 107 due to the difference of the linear expansion coefficient between the heat transfer plate 102 and the wiring substrate 104, and also between the heat transfer plate 102 and the package 112. In this embodiment, the package 112 is equivalent to the mounting substrate for mounting the LED chip 10. The components in common with that of the first embodiment are designated by the same reference numerals, whereby the explanations are omitted.

In a case where the lighting device in this embodiment is used as a light source of the lighting fixture, it is preferred to employ the epoxy resin sheet 110 having following characteristics. Specifically, the epoxy resin sheet 110 includes filler which is made of silica and alumina. The epoxy resin sheet 110 has a low viscosity when the epoxy resin sheet 110 is heated, and has a high flow property when the epoxy resin is heated. The epoxy resin sheet is exemplified by an organic green sheet such as an epoxy resin sheet 110 which is filled with fused silica. The epoxy resin sheet 110 is coupled to a metal component 100 and also a heat transfer plate 102 so as to couple the metal component 100 to the heat transfer plate 102. The metal component is, for example, the metal plate and the main body of the lighting fixture which is made of the metal. The organic green sheet 110 of the above has a high electrical insulation property and a high heat conductivity. In addition, the organic green sheet 110 has a high flow property when the organic green sheet 110 is heated. Furthermore, the organic green sheet 110 has a high adhesive property with respect to the irregularity surface. Therefore, in a case where the heat transfer plate 102 is coupled to the metal component 100 via the organic green sheet 110, it is possible to prevent a formation of the void between the organic green sheet 110 and the metal component 100 and also between the organic green sheet 110 and the heat transfer plate 102. (Specifically, first, the organic green sheet 110 is interposed between the heat transfer plate 102 and the metal component 100. Subsequently, the organic green sheet 110 is heated to couple the heat transfer plate 102 to the metal component 100.) Consequently, it is possible to prevent the increase of the thermal resistance and to prevent the variability of the thermal resistance due to the poor adhesion. Consequently, it is possible to reduce the thermal resistance from the LED chip 10 to the metal component 100, to enhance the heat radiation performance, and reduce the variability of the thermal resistance, compared with the prior case where the surface mounting type LED is mounted on the metal base print wiring substrate and where the gum sheet like heat radiation sheet is interposed between the metal base print wiring and the metal component. Consequently, it is possible to prevent the temperature increase of the junction temperature of the LED chip 10. As a result, the input electrical power is increased, and the light output is enhanced. In addition, in a case where the lighting device in the first to seventh embodiment is used as the light source of the lighting fixture, the metal component 100 is coupled to the heat transfer plate 21 of the mounting substrate 20 (such as FIGS. 1, 4 to 7) by the organic green sheet 110.

In the lighting device of this embodiment, the surface mounting type LED 1 comprises the LED chip 10, the package 112, and the first color conversion member 61 which is disposed on the light emitting surface 11 of the LED chip 10. The second color conversion member 62 is disposed to be cooperative with the wiring substrate 104 to surround the surface mounting type LED 1.

The LED chip 10 in this embodiment is provided at its first surface (in FIG. 8, the upper surface) with electrodes (which is not shown). The package 112 is a ceramic substrate which is formed at its first surface with a recess 112a for placing the LED chip 10. The electrodes of the LED chip 10 are electrically connected to patterned electrical conductors 114 via the bonding wires 117. The patterned electrical conductors 114 extend to the electrodes 113 for connecting to the outside. The electrodes 113 extend from a side surface of the package 112 to the second surface (rear surface). The package 112 is shaped to have a rectangular shape in the planar view.

In addition, the package 112 is provided with a conductor 115. The conductor 115 is made of the electrically conductive material such as Cu. The conductor 115 is provided for radiating the heat. The conductor 115 is provided at its center of the top surface with a mount section 115b which is projected. The LED chip 10 is coupled to the mount section 115b of the conductor 115 via a solder (such as AuSn solder). In addition, the conductor 115 has a bottom surface which is located away from the second surface of the package 112 than the electrodes 113.

In addition, in the surface mounting type LED 1, the outer circumference of the thermal conductor 115 is located at an outside of an outer circumference of the LED chip 10 in the projection view. The LED chip 10 is located within a projection domain of the thermal conductor 115. Therefore, the heat generated in the LED chip 10 is transferred to the thermal conductor 115 having a dimension which is larger than a dimension of the LED chip 10. Consequently, it is possible to prevent the temperature increase of the LED chip 10. As a result, the light output is increased, and the lifetime and the reliability of the LED chip 10 are improved. In addition, it is possible to mount the LED chip 10 on the mount section 115 through the sub mount substrate which has a stress relaxation function of relaxing the stress applied to the LED chip 10 due to the difference of the coefficient of linear expansion between the LED chip 10 and the thermal conductor 115, and which has a heat conductive property of transferring the heat generated in the LED chip 10 to the area of the mount section 115 which is larger than a chip size of the LED chip 10.

The material of the package 112 is not limited to a ceramic such as alumina. That is, it is possible to use a glass epoxy resin (having a high electrical insulation property) and liquid crystal polymer (having a high thermal resistance). In addition, the material of the thermal conductor 115 is not limited to Cu. That is, CuW is, for example, used as the material of the thermal conductor 115. Furthermore, the mount section 115b is not essential in this embodiment. That is, as for modification, it is possible to employ the die pad section for die-bonding the LED chip 10 on the bottom of the recess 112a of the package 112.

In addition, the recess 112a of the package 112 has a circular opening area which gradually becomes larger as the distance from the bottom is increased. Furthermore, the package 112 is provided at a portion adjacent to the opening face with a step 112b. In the surface mounting type LED 1, a circumference of the light transmissive member (cover) 116 having a circular sheet shape in a planar view is adhered to the step 112b by the adhesive material, whereby the recess 112a of the package 112 is closed by the light transmissive member 116. The space surrounded by the package 112 and the light transmissive member 116 is filled with the light transmissive sealing material which seals the LED chip 10, the first color conversion member 61, and the bonding wires 117. The light transmissive sealing material is such as the silicone resin, the epoxy resin, the acrylic resin, the polycarbonate resin, and the glass. However, it is possible to fill the space with the air and inactive gas. In addition, it is also possible to incorporate the cap in the space sounded by the package 112 and the light transmissive member 116 in order to distribute the light and to improve the light extraction efficiency. In addition, the shape of the light transmissive member 116 is not limited to the sheet shape. It is possible to employ the light transmissive member 116 being shaped to have a dome shape to act as a cap.

The heat transfer plate 102 of the first heat conductive material is shaped to have a rectangular shape. The first surface of the heat transfer plate 102 is coupled to the wiring substrate 104 via the stress relaxation member 108. The stress relaxation member 108 is made of a thermoplastic resin. The stress relaxation member 108 is realized by APAS (which is trade name of Sumitomo 3M Ltd). It should be noted that the first heat conductive material in this embodiment is made of Cu. However, it is possible to use Al as the material of the first heat conductive material instead of Cu.

The wiring substrate 104 is, similar to the heat transfer plate 102, shaped to have a rectangular plate shape. The wiring substrate 104 is formed at its center with an aperture 143. The aperture is shaped to have a rectangular shape. The aperture is provided for placing the sub mount substrate 103 within the aperture 143 such that the entire outer circumference of the sub mount substrate 103 is spaced from the wiring substrate 104.

The wiring substrate 104 comprises an electrical insulation substrate 141, patterned wirings 142, and the protective layer 144. The electrical insulation substrate 141 is made of polyimide film. The electrical insulation substrate 141 is provided at its first surface with a pair of patterned wirings 142. The patterned wirings 142 are provided for supplying the electrical power to the surface mounting type LED 1. The protective layer 144 is disposed on the first surface of the electrical insulation substrate 141 such that the protective layer 144 covers the patterned wirings 142 and a portion other than the patterned wirings 142. The protective layer 144 is made of resin having a white color. The patterned wirings 142 of the wiring substrate 104 are made of Cu. In addition, the electrical insulation substrate 141 made of FR4, FR5, and a paper phenol resin may be used.

The second heat conductive material of the sub mount substrate 103 is an AlN which has an electrical insulation property. The thermal conductor 115 of the surface mounting type LED 1 is coupled to the sub mount surface 103 via AuSn. The sub mount substrate 103 is provided at its contact surface with a metal layer 131 which is made of Au. The thermal conductor 115 is also provided at its contact surface with a metal layer 119 which is also made of Au. The material for coupling the thermal conductor 115 and the sub mount substrate 103 is not limited to AuSn. That is, it is possible to use solders such as AuSn, SnPb, and SnAgCu, and Ag paste for coupling the thermal conductor 115 with the sub mount substrate 103.

In addition, the sub mount substrate 103 is coupled to the heat transfer plate 102 by a fourth coupling member 134 which is made of AuSn. The sub mount substrate 103 is provided with a metal layer 132 which is coupled to the fourth coupling member 134. The heat transfer plate 102 is also provided with a metal layer 122 which is couple to the fourth coupling member 134. It is noted that the material for coupling the sub mount substrate 103 with the heat transfer plate 102 is not limited to AuSn. Solders such as AuSn, SnPb, and SnAgCu, and an Ag Paste may be used as the material for coupling the sub mount substrate 103 with the heat transfer plate 102.

The sub mount substrate 103 has a heat transfer function of transferring the heat which is generated in the LED chip 10 of the surface mounting type LED 1. The sub mount substrate 103 has a first surface which mounts the thermal conductor 115. The first surface of the sub mount substrate 103 has a dimension. The thermal conductor 115 has a second surface which faces to the sub mount substrate 103. The second surface of the thermal conductor 115 has a dimension. The dimension of the first surface of the sub mount substrate is larger than the dimension of the second surface of the thermal conductor 115. That is, the sub mount substrate 103 is shaped to have a rectangular shape which is larger than a planar size of the thermal conductor 115 of the surface mounting type LED 1. The sub mount substrate 103 has a first surface which faces to the thermal conductor 115. The metal layer 131 on the first surface of the sub mount substrate 103 has a dimension which is smaller than the planar size of the sub mount substrate 103. The lighting device in this embodiment comprises the sub mount substrate 103 which intersects with the package 112 of the surface mounting type LED 1 in the planar view. Consequently, a part of the second junction member which couples thermal conductor 115 on the second surface of the package 112 with the sub mount substrate 103 may extends to the outside of the outer circumference of the package 112 in the planar view. Consequently, it is possible to visually confirm an existence or nonexistence of the solder fillet of the second junction member 107. Therefore, it is possible to easily confirm a junction condition of the second junction member 107 visually. The first junction members 106, 106 (which couples the electrodes 113, 113 with the patterned wirings 142, 142, respectively) are formed from the second surface (rear surface) to the side surface of the package 112. Therefore, it is possible to visually confirm an existence or nonexistence of the solder fillet. Consequently, it is possible to easily confirm a junction condition of the first junction members 106, 106 visually.

The material of the sub mount substrate 103 is not limited to AlN. It is possible to employ the sub mount substrate 103 which is made of a material which is same as the material of the first heat conductive material (such as Cu) of the heat transfer plate 102. In this case, it is preferred to form the sub mount substrate 103 integral with the heat transfer plate 102. Consequently, it is possible to reduce the component count, to manufacture easily, and to manufacture at low cost. In this case, it is more preferred to employ an organic green sheet for electrically insulating the heat transfer plate from the metal components 100.

As explained above, in the lighting device of this embodiment, the second color conversion member 62 has a dome shape. The second color conversion member 62 is attached to the mounting substrate via the rim such that the second color conversion member 62 incorporates the first color conversion member 61 and the LED chip 10. Consequently, the light which is emitted from the LED chip 10 is emitted to the outside of the lighting fixture through the first color conversion member 61 and the second color conversion member 62. Therefore, it is possible to prevent the color unevenness of the light which is irradiated to the surface from the lighting fixture. In addition, the first color conversion member 61 is disposed on the light emitting surface 11 of the LED chip 10. The first color conversion member 61 comprises the first light transmissive material and the first phosphor. The first phosphor is excited by the light which is emitted from the LED chip 10 so as to give off the visible light having a wavelength longer than the wavelength of the light which is emitted from the light. The first color conversion member 61 is configured to generate the heat having the amount of heat generation which is greater than the amount of heat generation of the heat in the second color conversion member 62. Consequently, it is possible to prevent the temperature increase of the second phosphor of the second color conversion member 62. In addition, the heat generated in the first phosphor of the first color conversion member 61 is effectively released to the mounting substrate 20 through the LED chip 10. Therefore, it is possible to prevent the temperature quenching due to the temperature increase of each the first phosphor and the second phosphor. It is noted that, in this embodiment, the first phosphor is made of a yellow phosphor. The second phosphor is made of a red phosphor and a green phosphor. However, the kinds of the first phosphor and the second phosphor are not limited thereto. That is, it is possible to employ the first phosphor and the second phosphor being made of the material disclosed in the other embodiments.

In addition, the lighting device in this embodiment comprises the sub mount substrate 103 and the wiring substrate 104. The sub mount substrate 103 is made of the second heat conductive material. The sub mount substrate 103 is disposed on the first surface of the heat transfer plate 102 which is made of the first heat conductive material. The wiring substrate 104 comprises the electrical insulation substrate 141 and the patterned wirings 142, 142. The patterned wirings 142, 142 are formed on the first surface of the electrical insulation substrate 141. The electrical insulation substrate 141 is formed with an aperture 143. The aperture 141 is penetrated through the electrical insulation substrate 141 along the thickness direction of the electrical insulation substrate 141. The sub mount substrate is disposed within the aperture such that the sub mount substrate 103 has the entire outer circumference which is spaced from the electrical insulation substrate 141. The wiring substrate 104 is disposed on the first surface of the heat transfer plate 102. In the surface mounting type LED 1, the package 112 incorporates the LED chip 10, and is provided with the electrodes 113, 113 (for establishing the electrical connection to the outside). The electrodes 113, 113 are electrically coupled to the patterned wirings 142, 142 (which is disposed on the first surface of the wiring substrate 104) via the first junction members 106, 106 (such as the solder), respectively. The thermal conductor 115 on the second surface (rear surface) of the package 112 is coupled to the sub mount substrate 103 via the second junction material (solder). Therefore, the heat generated in the LED chip 10 is released to the heat transfer plate 102 through the thermal conductor 115 and the sub mount substrate 103 which are disposed at a rear side of the package 112. With this configuration, the thermal resistance of the heat releasing path is reduced, compared with a case where the insulation resin layer is disposed in the heat releasing path. As a result, it is possible to prevent the temperature increase of the LED chip 10, whereby the light output is improved. It is noted that the first junction material is preferably in common with the second junction material.

In addition, in the lighting device, the aperture 143 of the wiring substrate 104 has an entire inner circumference surface which is spaced from the sub mount substrate 103. The stress relaxation member 108 is disposed between the heat transfer plate 102 and the wiring substrate 104. The stress relaxation member 108 is configured to bond the heat transfer plate 102 and the wiring substrate 104. The stress relaxation member 108 is configured to relax the stress which is applied to each one of the first junction member 106 and the second junction member 107 due to the difference of coefficient of linear expansions "between the heat transfer plate 102 and the wiring substrate 104" and "between the heat transfer plate 102 and the package 112". Consequently, it is possible to relax the stress applied to each junction members 106, 107 due to temperature cycle, compared with a case where the heat transfer plate 102 and the wiring substrate 104 is bonded by a thermosetting resin.

In addition, in the lighting device of this embodiment, the sub mount substrate 103 is made of a material which has a heat conductive property and an electrical insulation property. Therefore, the surface mounting type LED 1 is thermally coupled to the heat transfer plate 102 via the sub mount substrate 103, while being electrically insulated from the heat transfer plate 102 via the sub mount substrate 103. This configuration, for example, makes it possible to reduce the electrical insulation member which is interposed between the heat transfer plate 102 and the metal component 100 in a case where the metal component 100 is disposed on the second surface of the heat transfer plate 102. In addition, under a condition where the organic green sheet 110 is interposed between "the metal component 100 on the second surface of the heat transfer plate 102" and "the heat transfer plate", it is possible to employ the organic green sheet 110 having a low electrical insulation property. As a result, the cost of the lighting device is reduced.

Ninth Embodiment

Figure 9:
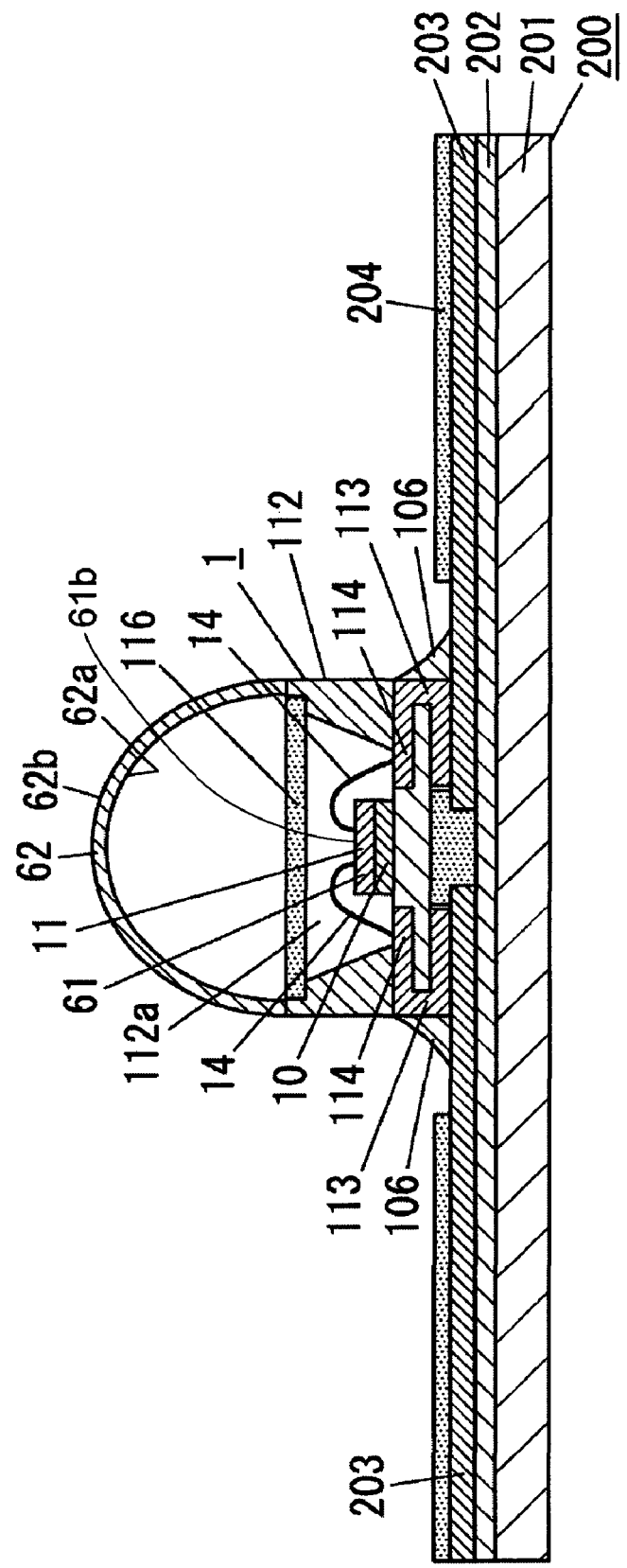
FIG. 9 shows a schematic side cross sectional view of the lighting device in the ninth embodiment.

A lighting device in this embodiment comprises basic components which are almost in common with the basic components of the eighth embodiment. The lighting device in this embodiment is different from the lighting device of the eighth embodiment in the following features. That is, as shown in FIG. 9, the surface mounting LED 1 is mounted on the metal substrate 200. (The metal substrate 200 is, in other words, a metal base printed wiring plate.) The metal substrate 200 comprises a metal plate 201, an electrical insulation layer 202, and patterned wirings 203. The electrical insulation layer 202 coats the metal substrate 201. The patterned wirings 203 are formed on the electrical insulation layer 202. The surface mounting LED 1 is mounted on the metal substrate 200 by means of reflow soldering. The second color conversion member 62 is adhered to the package 112 of the surface mounting type LED 1. In this embodiment, the components in common with the components of the eighth embodiment are designated by the same reference numerals, whereby the explanations are omitted.

In addition, the surface mounting type LED 1 has no thermal conductor 115 explained in the eighth embodiment. The electrodes 113 of the package 112 which incorporates the LED chip 10 is joined to the patterned wirings 203 on the first surface o the metal substrate by the junction members 106. The junction members 106 are, for example, made of the solder. In addition, the metal substrate 200 is provided with a protective layer 204. The protective layer 204 covers the patterned wirings 203 and also the portion other than the patterned wirings 203. The protective layer 204 is made of resin, and has a white color.

As explained above, the lighting device in this embodiment comprises the second color conversion member 62 which is shaped to have the dome shape. The second color conversion member 62 is attached to the mounting substrate via the rim such that the color conversion member 62 incorporates the first color conversion member 61 and the LED chip 10. Consequently, the light emitted from the LED chip 10 is emitted to the outside of the lighting device through the first color conversion member 61 and the second color conversion member 62. Therefore, it is possible to prevent the color unevenness of the light which is emitted from the lighting device and which is irradiated to the surface. In addition, it is possible to regulate the color of the light to a desired color by arbitrarily varying the second color conversion member 62. In addition, the first color conversion member 61 comprises the first light transmissive material including the first phosphor. The first phosphor is excited by the light which is emitted from the LED chip 10 so as to give off the visible light which has a wavelength longer than the wavelength of the light which is emitted from the LED chip 10. The first color conversion member 61 is stacked on the light emitting surface 11 of the LED chip 10. The first color conversion member 61 has a property of generating the heat having the amount of heat generation which is greater than the amount of the heat generation of the heat which is generated in the second color conversion member 62. Therefore, it is possible to prevent the temperature increase of the second phosphor of the second color conversion member 62. In addition, the heat generated by the first phosphor in the first color conversion member 61 is radiated to the metal substrate 200 through the LED chip 10 effectively. Therefore, this configuration makes it possible to prevent the temperature quenching due to the temperature increases of the first phosphor and the second phosphor.

In this embodiment, the lighting device comprises the second color conversion member 62 which is adhered to the surface mounting type LED 1. However, it is possible to enlarge the planar size of the second color conversion member 62 such that the second color conversion member 62 is cooperative with the metal substrate 200 to surround the surface mounting type LED 1. In addition, the shape of the light transmissive member 116 is not limited to the sheet shape. It is possible to employ the dome shaped light transmissive member 116. In this case, the light transmissive member 116 acts as a cap. Furthermore, it is also possible to employ the light transmissive member 116 which has a light exit surface having an irregular surface to have a convex-concave profile.

Although the present invention is described with particular reference to the above illustrated embodiments, the present invention should not be limited thereto, and should be interpreted to encompass any combinations of the individual features of the embodiments.

The invention claimed is:

1. A lighting device comprising:
an LED chip having a light emitting surface, and being configured to emit a light from said light emitting surface;
a mounting substrate being configured to mount said LED chip;
a first color conversion member comprising a first light transmissive material and a first phosphor, said first phosphor being excited by the light which is emitted from said LED chip, thereby giving off a first light having a wavelength which is longer than a wavelength of the light emitted from said LED chip, said first color conversion member being directly disposed on said light emitting surface of said LED chip,
a second color conversion member comprising a second light transmissive material and a second phosphor, said second phosphor being excited by the light which is emitted from said LED chip, thereby giving off a second light having a wavelength which is longer than the wavelength of the light emitted from said LED chip, said second color conversion member being shaped to have a dome-shape,
wherein said LED chip and said first color conversion member are disposed between said mounting substrate and said second color conversion member, and
wherein said first color conversion member is configured to generate heat having a first amount of heat generation when the first color conversion member is excited by the light which is emitted from said LED chip,
said second color conversion member being configured to generate heat having a second amount of heat generation when the second color conversion member is excited by the light which is emitted from said LED chip, and
the first amount of the heat generation being greater than the second amount of the heat generation.

2. The lighting device as set forth in claim 1, wherein
said lighting device further comprising a sealing layer, said sealing layer comprising a cap and a light transmissive sealing member,
said cap being cooperative with said mounting substrate to incorporate said LED chip and said first color conversion member therein,
said light transmissive sealing member being disposed to fill a space between said cap and said mounting substrate,
said second color conversion member having a rim, said second color conversion member being attached to said mounting substrate via said rim, thereby surrounding said LED chip, said first color conversion member, and said sealing layer,
said second color conversion member being attached to said mounting substrate so as to leave an air layer between said second color conversion member and said cap.

3. The lighting device as set forth in claim 2, wherein
said second color conversion member being attached to said mounting substrate so as to leave the air layer between said second color conversion member and an entire outside surface of said cap.

4. The lighting device as set forth in claim 1, wherein,
said first color conversion member having an emission surface for emitting the first light,
said emission surface being located so as to be opposed to said second color conversion member,
said emission surface being shaped to be unevenness.

5. The lighting device as set forth in claim 1, wherein
said lighting device further comprising a sealing layer, said sealing layer comprising a light transmissive sealing member, said light transmissive sealing member being attached to said mounting substrate so as to seal said LED chip and said first color conversion member,
said light transmissive sealing member comprising a resin which is exclusive of phosphor or a glass which is exclusive of phosphor,
said second color conversion member having a rim, said second color conversion member being attached to said mounting substrate via said rim, thereby surrounding said LED chip, said first color conversion member, and said light transmissive sealing member,
said second color conversion member being attached to said mounting substrate so as to leave an air layer between said cap and said second color conversion member.

6. The lighting device as set forth in claim 5, wherein
said second color conversion member being attached to said mounting substrate so as to leave the air layer between an entire outside surface of said sealing layer and said second color conversion member.

7. The lighting device as set forth in claim 1, wherein
said light emitting surface has a first dimension,
said first color conversion member being shaped into sheet shape, and disposed on said light emitting surface, said first color conversion member having a planar dimension which is equal to or smaller than said first dimension,
said first color conversion member being disposed on said light emitting surface such that said first color conversion member being located within an outer circumference of said light emitting surface.

8. The lighting device as set forth in claim 7, wherein
said lighting device further comprising a sealing layer, said sealing layer comprising a light transmissive sealing member, said light transmissive sealing member being attached to said mounting substrate so as to seal said LED chip and said first color conversion member,
said light transmissive sealing member comprising a resin which is exclusive of phosphor or a glass which is exclusive of phosphor,
said second color conversion member having a rim, said second color conversion member being attached to said mounting substrate via said rim, thereby surrounding said LED chip, said first color conversion member, and said light transmissive sealing member,
said second color conversion member being attached to said mounting substrate so as to leave an air layer between an entire outside surface of said sealing layer and said second color conversion member.

9. The lighting device as set forth in claim 2, wherein,
said first color conversion member having an emission surface for emitting the first light,
said emission surface being located so as to be opposed to said second color conversion member,
said emission surface being shaped to be unevenness.

10. The lighting device as set forth in claim 3, wherein,
said first color conversion member having an emission surface for emitting the first light,
said emission surface being located so as to be opposed to said second color conversion member,
said emission surface being shaped to be unevenness.

* * * * *